United States Patent
Chen

(10) Patent No.: US 10,658,392 B1
(45) Date of Patent: May 19, 2020

(54) MICRO LIGHT-EMITTING DIODE DISPLAY DEVICE AND MICRO LIGHT-EMITTING DIODE DRIVING CIRCUIT THEREOF

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 0 days.

(21) Appl. No.: 16/191,470

(22) Filed: Nov. 15, 2018

(51) Int. Cl.
*H01L 27/12* (2006.01)
*H01L 29/786* (2006.01)
*H01L 29/423* (2006.01)

(52) U.S. Cl.
CPC ...... *H01L 27/1222* (2013.01); *H01L 27/1248* (2013.01); *H01L 29/4238* (2013.01); *H01L 29/78648* (2013.01)

(58) Field of Classification Search
None
See application file for complete search history.

(56) References Cited

U.S. PATENT DOCUMENTS

2013/0207101 A1* 8/2013 Yamazaki ........... H01L 29/0692
257/43
2017/0062650 A1* 3/2017 Chen ...................... H01L 24/83
2019/0355932 A1* 11/2019 Choung .............. H01L 51/5012

OTHER PUBLICATIONS

Y. H. Byun et al., "An Amorphous Silicon TFT with Annular-Shaped Channel and Reduced Gate-Source Capacitance," IEEE Transactions on Electron Devices, vol. 43, No. 5, pp. 839-841, May 1996.

\* cited by examiner

*Primary Examiner* — Shaun M Campbell
(74) *Attorney, Agent, or Firm* — CKC & Partners Co., LLC

(57) ABSTRACT

A micro light-emitting diode display device including a driving transistor and a micro light-emitting diode is provided. The driving transistor includes a substrate, a bottom gate, a gate insulator, a semiconductor layer, an etch stopper, a drain electrode, a source electrode, and an insulating layer. The drain electrode is ring-shaped and a contact portion between the drain electrode and the semiconductor layer surrounds the semiconductor layer. The source electrode is in contact with the semiconductor layer and is enclosed by the drain electrode. The insulating layer has a via therein to expose a portion of the source electrode. The micro light-emitting diode is electrically connected to the source electrode. The micro light-emitting diode includes a current injection channel present in the micro-light emitting diode. The current injection channel is separated from a side surface of the micro light-emitting diode.

18 Claims, 16 Drawing Sheets

MICRO LIGHT-EMITTING DIODE DISPLAY DEVICE AND MICRO LIGHT-EMITTING DIODE DRIVING CIRCUIT THEREOF

BACKGROUND

Field of Invention

The present disclosure relates to a low power micro light-emitting diode display device and a low power micro light-emitting diode driving circuit.

Description of Related Art

The statements in this section merely provide background information related to the present disclosure and do not necessarily constitute prior art.

In recent years, micro devices have become popular in various applications. One of the promising subfield is micro light-emitting diode devices, and one of the important issues of said subfield is the power consumption of a micro light-emitting diode driving circuit.

SUMMARY

According to some embodiments of the present disclosure, a micro light-emitting diode display device including a driving transistor and a micro light-emitting diode is provided. The driving transistor includes a substrate, a bottom gate, a gate insulator, a semiconductor layer, an etch stopper, a drain electrode, a source electrode, and an insulating layer. The bottom gate is present on the substrate. The gate insulator is present on the bottom gate. The semiconductor layer is present on the gate insulator. The etch stopper is present on the semiconductor layer, and the etch stopper is ring-shaped. The drain electrode is present on the etch stopper and is in contact with the semiconductor layer. The drain electrode is ring-shaped and a contact portion between the drain electrode and the semiconductor layer surrounds the semiconductor layer. The source electrode is present on the etch stopper and is in contact with the semiconductor layer. The source electrode is enclosed by the drain electrode. The drain electrode and the source electrode form a ring-shaped opening. At least a portion of the etch stopper is exposed by the ring-shaped opening. The insulating layer is present on the drain electrode, the source electrode, and the etch stopper. The insulating layer has at least one via therein to expose a portion of one of the source electrode and the drain electrode, or to expose a portion of the source electrode and a portion of the drain electrode. The micro light-emitting diode having a lateral length less than or equal to 50 µm is electrically connected to one of the source electrode and the drain electrode. The micro light-emitting diode includes a first type semiconductor layer, an active layer, and a second type semiconductor layer. The active layer is present on and joined with the first type semiconductor layer. The second type semiconductor layer present on and joined with the active layer. A current injection channel present in the micro light-emitting diode. The current injection channel is extended within one of the first type semiconductor layer and the second type semiconductor layer of the micro light-emitting diode, and the current injection channel is separated from a side surface of the micro light-emitting diode.

According to some embodiments of the present disclosure, a micro light-emitting diode display device including a driving transistor and a micro light-emitting diode is provided. The driving transistor includes a substrate, a semiconductor layer, a drain electrode, a source electrode, a gate insulator, and a top gate. The semiconductor layer is present on the substrate. The drain electrode is present on the substrate and is in contact with the semiconductor layer. The drain electrode is ring-shaped. A contact portion between the drain electrode and the semiconductor layer surrounds the semiconductor layer. The source electrode is present on and in contact with the semiconductor layer. The source electrode is enclosed by the drain electrode. The drain electrode and the source electrode form a ring-shaped opening. At least a portion of the semiconductor layer is exposed by the ring-shaped opening. A gate insulator is present on the drain electrode, the source electrode, and the semiconductor layer. The gate insulator has at least one via therein to expose a portion of one of the source electrode and the drain electrode, or to expose a portion of the source electrode and a portion of the drain electrode. The top gate present on the gate insulator. The semiconductor layer is between the top gate and the substrate. The micro light-emitting diode having a lateral length less than or equal to 50 µm is electrically connected to one of the source electrode and the drain electrode. The micro light-emitting diode includes a first type semiconductor layer, an active layer, and a second type semiconductor layer. The active layer is present on and joined with the first type semiconductor layer. The second type semiconductor layer present on and joined with the active layer. A current injection channel present in the micro light-emitting diode. The current injection channel is extended within one of the first type semiconductor layer and the second type semiconductor layer of the micro light-emitting diode, and the current injection channel is separated from a side surface of the micro light-emitting diode.

According to some embodiments of the present disclosure, a micro light-emitting diode driving circuit including a storage capacitor, a switching transistor, a micro light-emitting diode, and a driving transistor is provided. The storage capacitor has two ends. The switching transistor has three terminals. One of the three terminals is a gate terminal connected to a scan line, another one of the three terminals is a drain terminal connected to a data line, and a remaining one of the three terminals is a source terminal connected to one end of the storage capacitor. The micro light-emitting diode has an anode and a cathode. The micro light-emitting diode receives a first driving voltage from a driving voltage source and is electrically connected to the low voltage source. The driving transistor has a gate terminal, a drain terminal, and a source terminal. The gate terminal is connected to the source terminal of the switching transistor. The driving transistor receives a second driving voltage from a driving voltage source and is electrically connected to the micro light-emitting diode and the low voltage source.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1A:
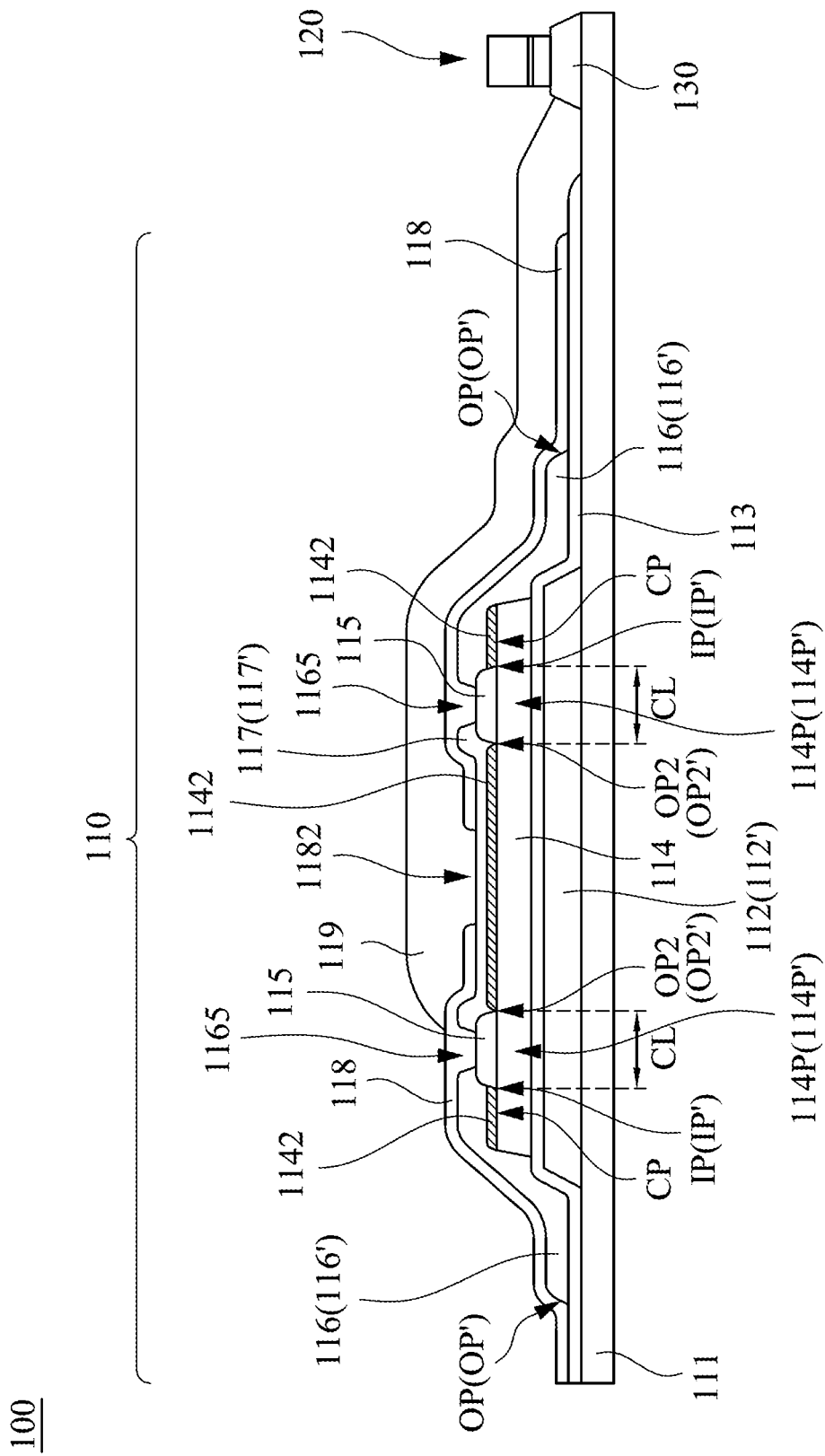
FIG. 1A is a cross-sectional view of a micro light-emitting diode display device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment", "some embodiments" or the like means that a particular feature, structure, configuration, or characteristic described in connection with the embodiment is included in at least one embodiment of the disclosure. Thus, the appearances of the phrase "in one embodiment," "in an embodiment", "in some embodiments" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Although most of terms described in the following disclosure use singular nouns, said terms may also be plural in accordance with figures or practical applications.

Figure 1B:
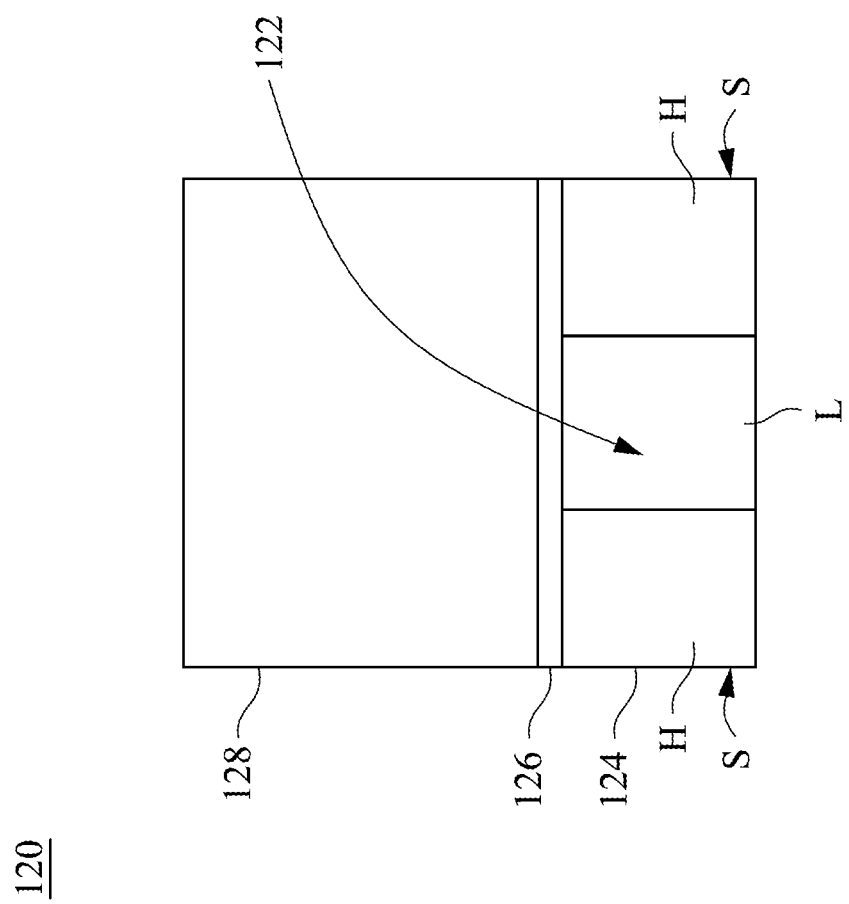
FIG. 1B is an enlarged cross-sectional view of a micro light-emitting diode according to some embodiments of the present disclosure.

References are made to FIGS. 1A and 1B. FIG. 1A is a cross-sectional view of a micro light-emitting diode display device 100 according to some embodiments of the present disclosure. FIG. 1B is an enlarged cross-sectional view of a micro light-emitting diode 120 according to some embodiments of the present disclosure. In some embodiments, the micro light-emitting diode display device 100 includes a driving transistor 110 and a micro light-emitting diode 120. In some embodiments, the driving transistor 110 includes a substrate 111, a bottom gate 112(112'), a gate insulator 113, a semiconductor layer 114, an etch stopper 115, a drain electrode 116 (116'), a source electrode 117 (117'), and an insulating layer 118. The substrate 111 can be a glass substrate, a silicon dioxide ($SiO_2$) substrate, or a silicon wafer. The bottom gate 112(112') is present on the substrate 111. The gate insulator 113 is present on the bottom gate 112(112'). In some embodiments, the gate insulator 113 is in contact with the substrate 111 and the bottom gate 112(112'). The semiconductor layer 114 is present on the gate insulator 113. A material of the semiconductor layer 114 can include (hydrogenated) amorphous silicon (a-Si:H), indium gallium zinc oxide (IGZO), gallium zinc oxide (GZO), or indium zinc oxide (IZO), but should not be limited thereto. A channel length CL of the semiconductor layer 114 can be about 2 μm to 10 μm. Said channel length CL is a portion of the semiconductor layer 114 from an outer periphery of a contact portion between the source electrode 117 (117') and the semiconductor layer 114 to an inner periphery of a contact portion between the drain electrode 116 (116') and the semiconductor layer 114. In some embodiments when a highly conductive n+a-Si:H films 1142 is present in a case that the semiconductor layer 114 is an a-Si:H, said channel length CL is a portion of the semiconductor layer 114 from an outer periphery OP2 (OP2') of a highly conductive n+a-Si:H films 1142 between the source electrode 117 (117') and the semiconductor layer 114 to an inner periphery IP (IP') of a highly conductive n+a-Si:H films 1142 between the drain electrode 116 (116') and the semiconductor layer 114 (i.e. a length of a channel 114P or 114P'). Other types of the semiconductor layer may also use similar ways mentioned above to form a channel and to define the channel length. Said highly conductive n+a-Si:H films 1142 will be described in details later. In some embodiments, a vertical projection of at least a portion of the semiconductor layer 114 on the substrate 111 is overlapped with a vertical projection of the bottom gate 112 (112') on the substrate 111. The etch stopper 115 is present on the semiconductor layer 114, and the etch stopper 115 is ring-shaped when viewed from a top view (e.g., a view point of FIGS. 1C and 1D as will be described later). The etch stopper 115 can protect the underlying semiconductor layer 114 from damages during an etching process, so as to maintain the quality of the semiconductor layer 114. A lateral length of the etch stopper 115 is about 2 μm to 10 μm, such as 7 μm for a tolerance of mask alignment. A direction of said length is parallel to an extension of the substrate 111 in a cross-sectional view like FIG. 1A. In some embodiments, the etch stopper 115 is in contact with the semiconductor layer 114. The drain electrode 116 (116') is present on the etch stopper 115 and is in contact with the semiconductor layer 114. The drain electrode 116 (116') is ring-shaped (when viewed from a top view (e.g., a view point of FIGS. 1C and 1D as will be described later)) and a contact portion CP between the drain electrode 116 (116') and the semiconductor layer 114 surrounds the semiconductor layer 114. In some embodiments, the drain electrode 116 (116') is in contact with the etch stopper 115. The source electrode 117 (117') is present on the etch stopper 115 and is in contact with the semiconductor layer 114. The source electrode 117 (117') is enclosed by the drain electrode 116 (116') to form an asymmetric structure. A length of the inner periphery of the contact portion between the drain electrode 116 (116') and the semiconductor layer 114 is greater than a length of the outer periphery of the contact portion between the source electrode 117 (117') and the semiconductor layer 114 in the asymmetric structure. In some embodiments, such as those illustrated by FIG. 1A, it means that a length of the inner periphery IP(IP') is greater than a length of the outer periphery OP2 (OP2'). As a result, compared to conventional transistors, a pinch-off point is shifted to a lower drain-source voltage due to said asymmetric structure. Said channel length CL can be calculated as a function of a length of the outer periphery OP2' (denoted as $2\pi*R1$) and a length of the inner periphery IP' (denoted as $2\pi*R2$). That is, the channel length equals R2-R1, and the ratio between the channel width and the channel length CL is asymptotically approaching $2\pi/\ln(R2/R1)$ in a case of circular shape of the outer periphery OP2' and the inner periphery IP' (Y. H. Byun, W. D. Boer, M. Yang, and T. Gu, "An amorphous silicon TFT with annular-shaped channel and reduced gate-source capacitance," *IEEE Trans. Electron Devices*, vol. 43, no. 5, pp. 839-841, May 1996). Said R1 is a radius from a center of the semiconductor layer 114 to the outer periphery OP2'. Said R2 is a radius from a center of the semiconductor layer 114 to the inner periphery IP'. The technical effect of the above asymmetric structure will be described in more details later.

In some embodiments, the source electrode 117 (117') is in contact with the etch stopper 115. In order to reach ohmic contacts between the source electrode 117 (117') and the semiconductor layer 114 and between the drain electrode 116 (116') and the semiconductor layer 114, contact portions thereof can be heavily doped. Said heavy doping can also have a hole blocking function to prevent a hole leakage through contact portions. Therefore, in some embodiments, the semiconductor layer 114 further includes the highly conductive n+a-Si:H films 1142, especially when the semiconductor layer 114 is a-Si:H as mentioned. The highly conductive n+a-Si:H films 1142 are present between the source electrode 117 (117') and the semiconductor layer 114 and between the drain electrode 116 (116') and the semiconductor layer 114. In general, the highly conductive n+a-Si:H films 1142 have a resistivity which is about seven orders magnitude lower than that of the intrinsic a-Si:H. In some other embodiments, such as when the semiconductor layer 114 is an IGZO, said n+ doped films may not be necessary since the IGZO has much less hole carriers than that of a-Si:H, and the contact between the IGZO and the source/drain electrodes 117 (117')/116 (116') is much better than that between the a-Si:H and the source/drain electrodes 117 (117')/116 (116'). The drain electrode 116 (116') and the source electrode 117 (117') form a ring-shaped opening 1165. Said ring shape can be recognized by a top view like FIGS. 1C and 1D with a modified cross-section on the ring-shaped opening 1165, and will not be shown in details herein in figures for simplicity. At least a portion of the etch stopper 115 is exposed by the ring-shaped opening 1165. The insulating layer 118 is present on and covers the drain electrode 116 (116'), the source electrode 117 (117'), and the etch stopper 115. In some embodiments, the insulating layer 118 is in contact with the drain electrode 116 (116'), the source electrode 117 (117'), and the etch stopper 115. The insulating layer 118 has a via 1182 therein to expose a portion of the source electrode 117 (117'). The micro light-emitting diode 120 is electrically connected to the source electrode 117 (117').

In some embodiments, the micro light-emitting diode display device 100 further includes a connecting electrode 119 present on the insulating layer 118 and in contact with the source electrode 117 (117') through the via 1182.

In some embodiments, the micro light-emitting diode 120 may include a first type semiconductor layer 124, an active layer 126, and a second type semiconductor layer 128. The first type semiconductor layer 124 can be a p-type layer, and the second type semiconductor layer 128 can be an n-type layer, but should not be limited thereto. In some embodiments, the micro light-emitting diode 120 includes a current injection channel 122 (referring to FIG. 1B) present in the micro-light emitting diode 120. The current injection channel 122 is extended within one of the first type semiconductor layer 124 and the second type semiconductor layer 128 of the micro light-emitting diode 120, and is separated from a side surface S of the micro light-emitting diode 120. In some embodiments, the micro light-emitting diode display device 100 further includes a bottom electrode 130 present on the substrate 111 and in contact with the connecting electrode 119 of the driving transistor 110. In some embodiments, the first type semiconductor layer 124 is present on and in contact with the bottom electrode 130. The active layer 126 is present on and is joined with the first type semiconductor layer 124. The second type semiconductor layer 128 is present on and joined with the active layer 126. One of the first type semiconductor layer 124 and the second type semiconductor layer 128 includes a low resistance portion L and a high resistance portion H. The low resistance portion L is separated from at least one side surface S of said one of the first type semiconductor layer 124 and the second type semiconductor layer 128 by the high resistance portion H. The resistivity of said one of the first type semiconductor layer 124 and the second type semiconductor layer 128 increases from the low resistance portion L toward the high resistance portion H. Lateral length (in a direction parallel to extensions of the substrate 111) of the first type semiconductor layer 124, the active layer 126, and the second type semiconductor layer 128 are less than or equal to 50 μm.

Figure 1C:
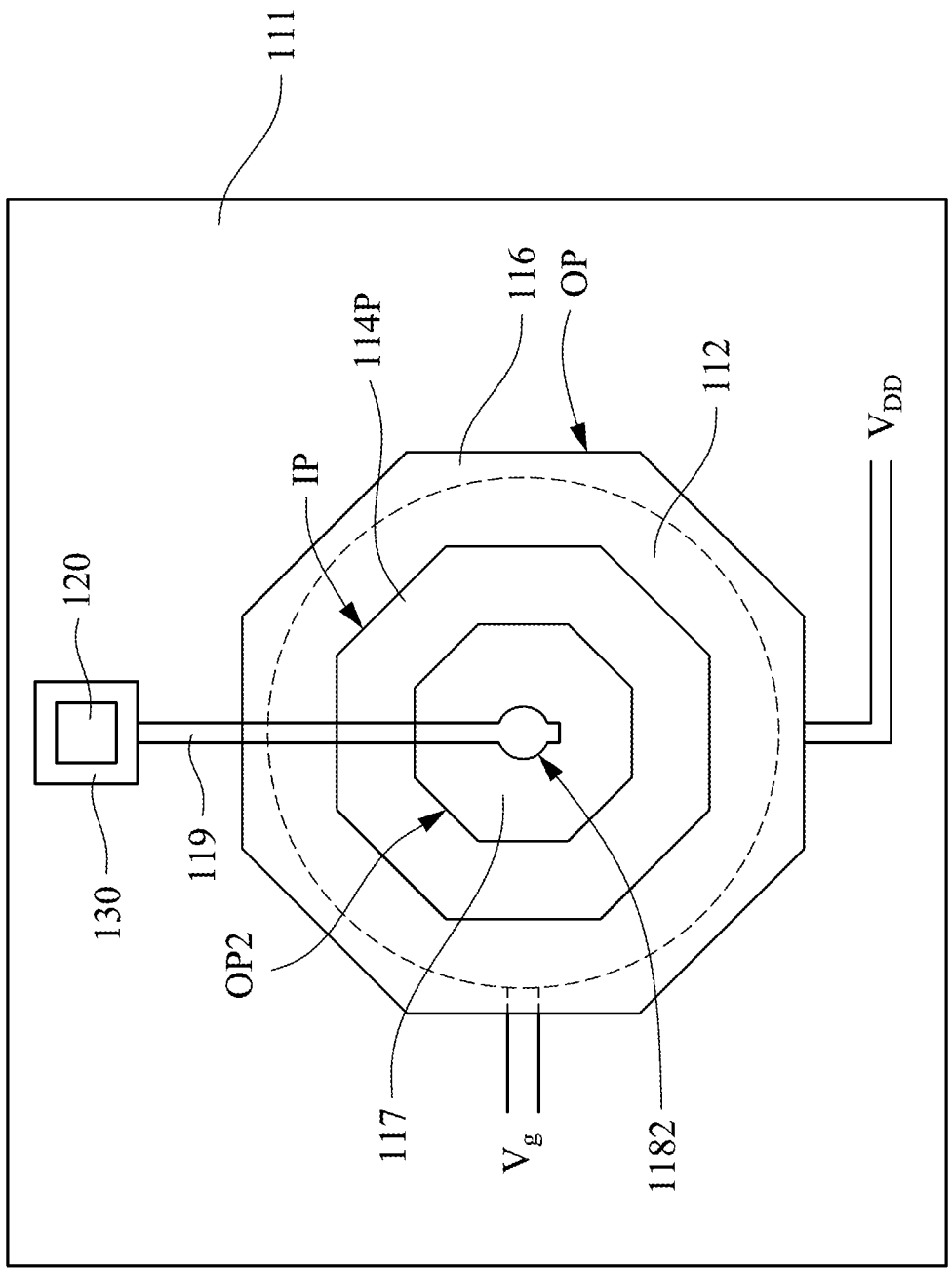
FIG. 1C is a top view of a micro light-emitting diode display device according to some embodiments of the present disclosure.
Figure 1D:
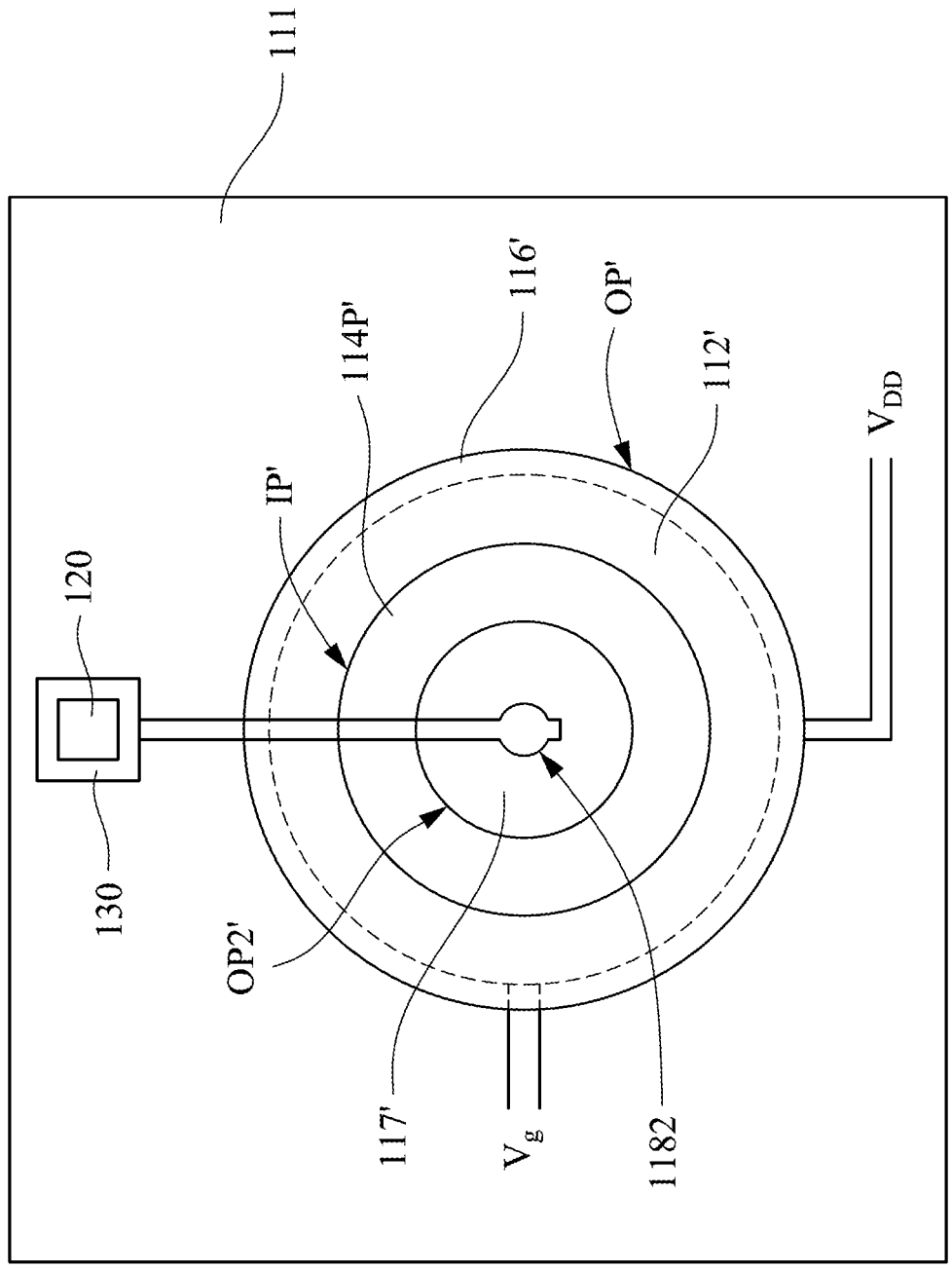
FIG. 1D is a top view of a micro light-emitting diode display device according to some embodiments of the present disclosure.

References are made to FIGS. 1A, 1C, and 1D. FIG. 1C is a top view of a micro light-emitting diode display device 100 according to some embodiments of the present disclosure. FIG. 1D is a top view of a micro light-emitting diode display device 100' according to some embodiments of the present disclosure. It should be noted that, FIGS. 1C and 1D do not show all elements shown in FIG. 1A, and the main purpose of FIGS. 1C and 1D is to show ring-shaped characteristics of the channel 114P or 114P'. As a result, some elements, such as the etch stopper 115, or a portion of the drain electrode 116 (116') and source electrode 117 (117') which cover a portion of the channel 114P (114P') are omitted, so that the features to be revealed in FIGS. 1C and 1D are more clear. Besides, the insulating layer 118 are omitted while the via 1182 are still remained in FIGS. 1C and 1D for clearly representing relative positions among each elements illustrated in FIGS. 1C and 1D. In some embodiments, a shape of a vertical projection of an inner periphery IP of the contact portion CP between the drain electrode 116 and the semiconductor layer 114 on the substrate 111 is octagonal, as shown in FIG. 1C. Specifically, in some embodiments, the contact portion CP can be the n+a-Si:H film 1142 between the drain electrode 116 and the semiconductor layer 114. The octagonal shape of the inner periphery IP of the contact portion CP can lead to an adequately nonuniform electric field, such as relative low electric field on each corner of the octagon compared to each edge of the octagon. Said geometry can reduce a part of the electric field generated from the semiconductor layer 114, so as to enhance the reliability of the thin film transistor (i.e., the driving transistor 110 of the present disclosure). Said adequately nonuniform electric field means an electric field that has nonuniformality as compared to e.g., a circular shape, but not too much as compared to e.g., a hexagonal shape. Although the hexagonal shape also has corners to reduce a part of the electric field, the corners are too sharp such that the enhancement of the reliability are not as significant as that of the octagonal shape. In some embodiments, a shape of a vertical projection of an outer periphery OP of the drain electrode 116 on the substrate is octagonal, as shown in FIG. 1C. The octagonal shape of the outer periphery OP of the drain electrode 116 allows a higher fill rate of the driving transistor 110 compared to, e.g., a circular shape of the outer periphery OP' of the drain electrode 116' as will be shown later in FIG. 1D. In some embodiments, a shape of a vertical projection of an inner periphery IP' of the contact portion CP between the drain electrode 116' and the semiconductor layer 114 on the substrate 111 is circular, as shown in FIG. 1D. In some embodiments, a shape of a vertical projection of an outer periphery OP' of the drain electrode 116' on the substrate is circular, as shown in FIG. 1D.

Figure 2A:
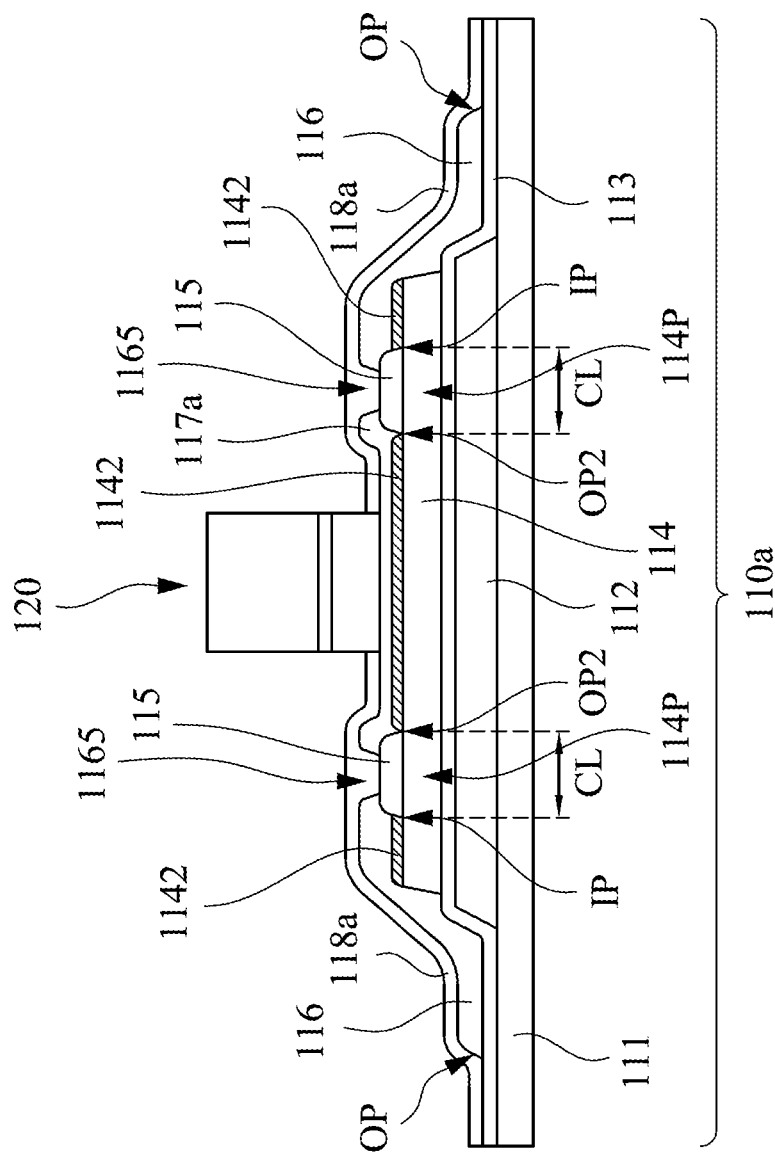
FIG. 2A is a cross-sectional view of a micro light-emitting diode display device according to some embodiments of the present disclosure.
Figure 2B:
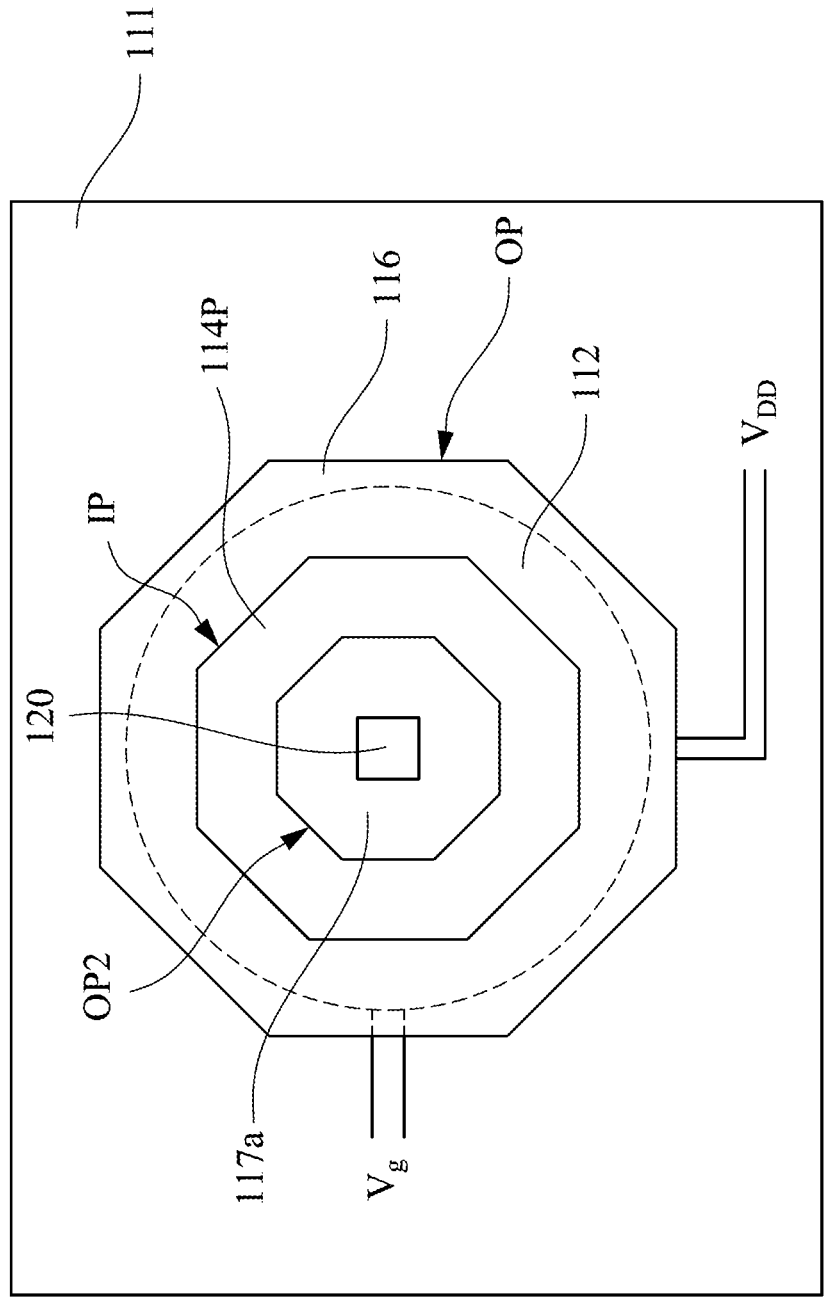
FIG. 2B is a top view of a micro light-emitting diode display device according to some embodiments of the present disclosure.

Reference is made to FIGS. 2A and 2B. FIG. 2A is a cross-sectional view of a micro light-emitting diode display device 100a according to some embodiments of the present disclosure. FIG. 2B is a top view of a micro light-emitting diode display device 100a according to some embodiments of the present disclosure. It should be noted that, FIG. 2B also do not show all elements shown in FIG. 2A, and the reason is the same as that of FIGS. 1C and 1D. In some embodiments, the micro light-emitting diode 120 is in contact with the source electrode 117a, which is the main different compared to the micro light-emitting diode display device 100. In the configuration as shown in FIGS. 2A and 2B, the spatial utilization rate can be enhanced.

Figure 3:
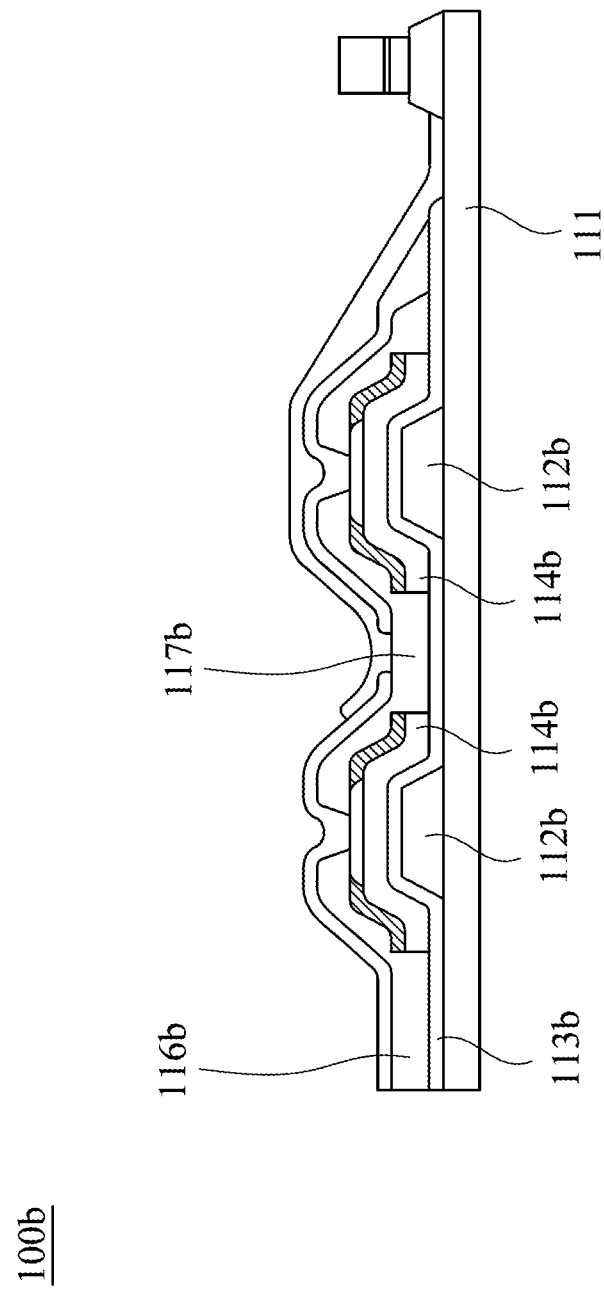
FIG. 3 is a cross-sectional view of a micro light-emitting diode display device according to some embodiments of the present disclosure.

Reference is made to FIG. 3. FIG. 3 is a cross-sectional view of a micro light-emitting diode display device 100b according to some embodiments of the present disclosure. In some embodiments, the bottom gate 112b and the semiconductor layer 114b are ring shaped, and the source electrode 117b is in contact with the gate insulator 113b. The ring-shaped bottom gate 112b and the ring-shaped semiconductor layer 114b are main differences between the embodiments shown in FIG. 3 and the embodiments shown in FIG. 1A. Said differences makes embodiments illustrated by FIG. 3 has smaller gate-source capacitance compared to the embodiments shown in FIG. 1A. The smaller gate-source capacitance makes it easier for modulating gate voltages, thus enabling high frequency operation. In some embodiments, the bottom gate 112b encloses a portion of the source electrode 117b when viewing from a top view like the view point shown in FIGS. 1C, 1D, and 2B. In some embodiments, the semiconductor layer 114b encloses a portion of the source electrode 117b.

Figure 4:
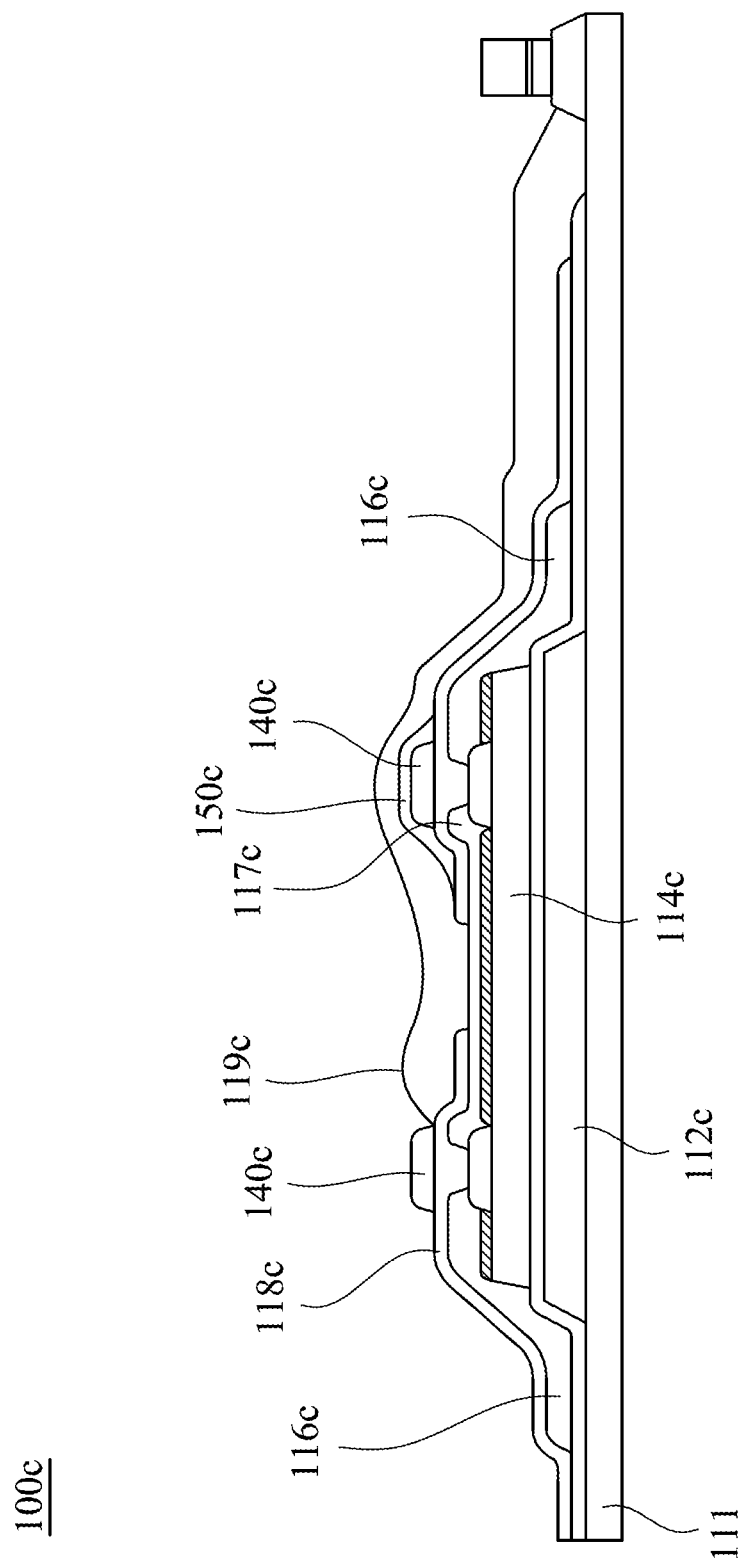
FIG. 4 is a cross-sectional view of a micro light-emitting diode display device according to some embodiments of the present disclosure.

Reference is made to FIG. 4. FIG. 4 is a cross-sectional view of a micro light-emitting diode display device 100c according to some embodiments of the present disclosure. In some embodiments, the micro light-emitting diode display device 100c further includes a top gate 140c compared to the micro light-emitting diode display device 100. At least a portion of the top gate 140c is present on the insulating layer 118c. In some embodiments, when there is a connecting electrode 119c present on the insulating layer 118c, at least a portion of the top gate 140c is present between the insulating layer 118c and the connecting electrode 119c. The top gate 140c is electrically isolated from the source electrode 117c and the drain electrode 116c by the insulating layer 118c. The semiconductor layer 114c is between the top gate 140c and the substrate 111. In some embodiments, the micro light-emitting diode display device 100c further includes a passivation layer 150c present on said portion of the top gate 140c and the insulating layer 118c to electrically isolate the top gate 140c from the connecting electrode 119c. In some embodiments, a vertical projection of the top gate 140c on the substrate 111 is overlapped with a vertical projection of at least a portion of the bottom gate 112c on the substrate 111, such that a gate voltage of at least a part of semiconductor layer 114c can be modified simultaneously by the top gate 140c and the bottom gate 112c. In this dual gate configuration, carriers can be induced in the semiconductor layer 114c on both sides respectively facing the top gate 140c and the bottom gate 112c, and thicknesses of both channels also increase compared to single gate (bottom gate or top gate) configurations because one channel is influenced by both the bottom gate 112c and the top gate 140c. As a result, resistivities of the channels decreases, and the reliability increases compared to single gate configurations.

Figure 5:
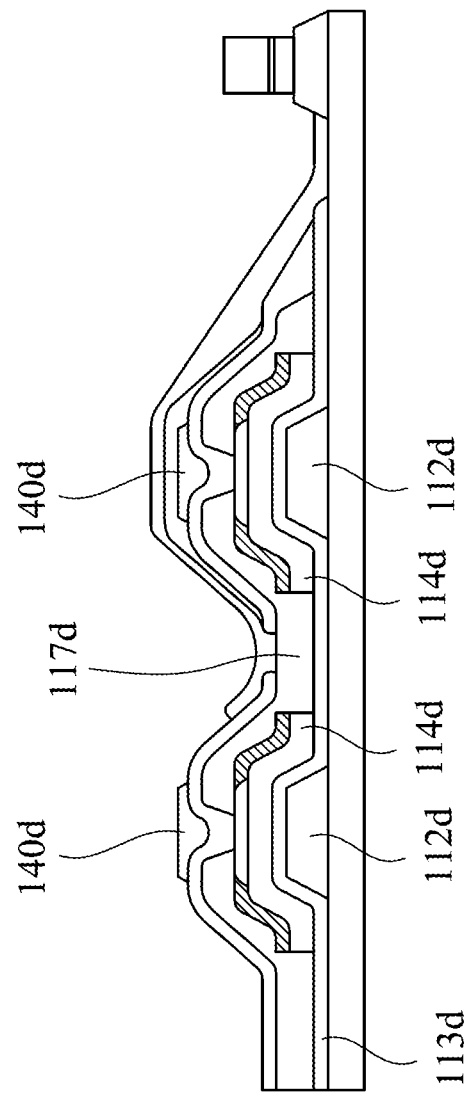
FIG. 5 is a cross-sectional view of a micro light-emitting diode display device according to some embodiments of the present disclosure.

Reference is made to FIG. 5. FIG. 5 is a cross-sectional view of a micro light-emitting diode display device 100d according to some embodiments of the present disclosure. The differences between embodiments illustrated by FIG. 5 and that of FIG. 4 are that, the bottom gate 112d and the semiconductor layer 114d of FIG. 5 is ring shaped, and the source electrode 117d is in contact with the gate insulator 113d. The advantage of ring-shaped bottom gate 112d and the semiconductor layer 114d is similar to that in the paragraph describing embodiments illustrated by FIG. 3, and will not be repeated herein.

Figure 6:
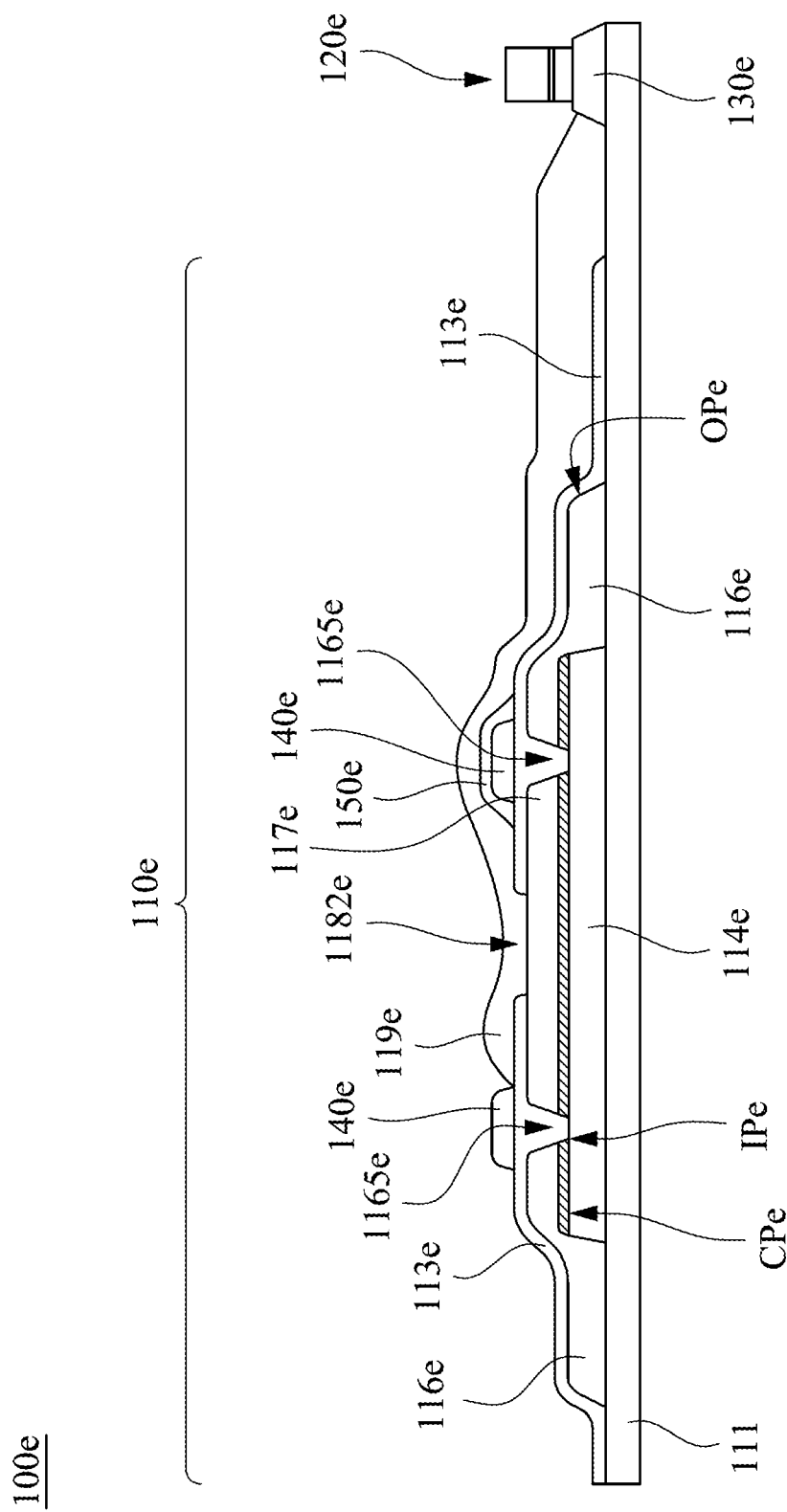
FIG. 6 is a cross-sectional view of a micro light-emitting diode display device according to some embodiments of the present disclosure.

Reference is made to FIG. 6. FIG. 6 is a cross-sectional view of a micro light-emitting diode display device 100e according to some embodiments of the present disclosure. In some embodiments, the micro light-emitting diode display device 100e includes a driving transistor 110e and a micro light-emitting diode 120e. The driving transistor 110e includes a substrate 111, a semiconductor layer 114e, a drain electrode 116e, a source electrode 117e, a gate insulator 113e, and a top gate 140e. The semiconductor layer 114e is present on the substrate 111. A material of the semiconductor layer 114e can include low temperature poly-silicon (LTPS), but should not be limited thereto. The channel length of LTPS semiconductor layer 114e is about 2 μm. The drain electrode 116e is present on the substrate 111 and in contact with the semiconductor layer 114e. In some embodiments, the drain electrode 116e is also in contact with the substrate 111. The drain electrode 116e is ring-shaped and a contact portion CPe between the drain electrode 116e and the semiconductor layer 114e surrounds the semiconductor layer 114e. The ring-shaped drain electrode 116e can be recognized from a top view analogous to FIGS. 1C and 1D, and will not be shown in details here for simplicity. The source electrode 117e is present on and in contact with the semiconductor layer 114e. The source electrode 117e is enclosed by the drain electrode 116e, and the drain electrode 116e and the source electrode 117e form a ring-shaped opening 1165e. At least a portion of the semiconductor layer 114e is exposed by the ring-shaped opening 1165e. The gate insulator 113e is present on the drain electrode 116e, the source electrode 117e, and the semiconductor layer 114e. In some embodiments, the gate insulator 113e is in contact with the drain electrode 116e, the source electrode 117e, and the semiconductor layer 114e. The gate insulator 113e has a via 1182e therein to expose a portion of the source electrode 117e. The top gate 140e is present on the gate insulator 113e. The semiconductor layer 114e is between the top gate 140e and the substrate 111. The micro light-emitting diode 120e is electrically connected to the source electrode 117e. Briefly speaking, the embodiments illustrated by FIG. 6 are top gate cases without any bottom gate.

In some embodiments, the micro light-emitting diode display device 100e further includes a connecting electrode 119e present on the gate insulator 113e and in contact with the source electrode 117e through the via 1182e. The top gate 140e is electrically isolated from the source electrode 117e and the drain electrode 116e by the gate insulator 113e. In some embodiments, the micro light-emitting diode display device 100e further includes a bottom electrode 130e present on the substrate 111 and is in contact with the connecting electrode 119e of the driving transistor 110e. In some embodiments, the micro light-emitting diode 120e is in contact with the bottom electrode 130e. In some embodiments, the micro light-emitting diode display device 100e further includes a passivation layer 150e present on at least a portion of the top gate 140e to electrically isolate the top gate 140e from the connecting electrode 119e, and in some embodiments the passivation layer 150e is also present on at least a portion of the gate insulator 113e. In some embodiments, the semiconductor layer is ring shaped and encloses a portion of the source electrode, like those illustrated by FIGS. 3 and 5, and will not be drawn again herein for simplicity.

Similar to embodiments as illustrated by FIGS. 1A to 1D and their technical effects, in some embodiments illustrated by FIG. 6, a shape of a vertical projection of an inner periphery IPe of the contact portion CPe between the drain electrode 116e and the semiconductor layer 114e on the substrate 111 can be octagonal or circular. Specifically, said inner periphery IPe can be an inner periphery of the n+ a-Si:H film 1142 when the semiconductor layer 114e is the a-Si:H. In some embodiments, a shape of a vertical projection of an outer periphery OPe of the drain electrode 116e on the substrate 111 can be octagonal or circular. In some embodiments, the micro light-emitting diode 120e can be in direct contact with the source electrode 117e, and said configuration is similar to the embodiments illustrated by FIG. 2A.

Figure 7:
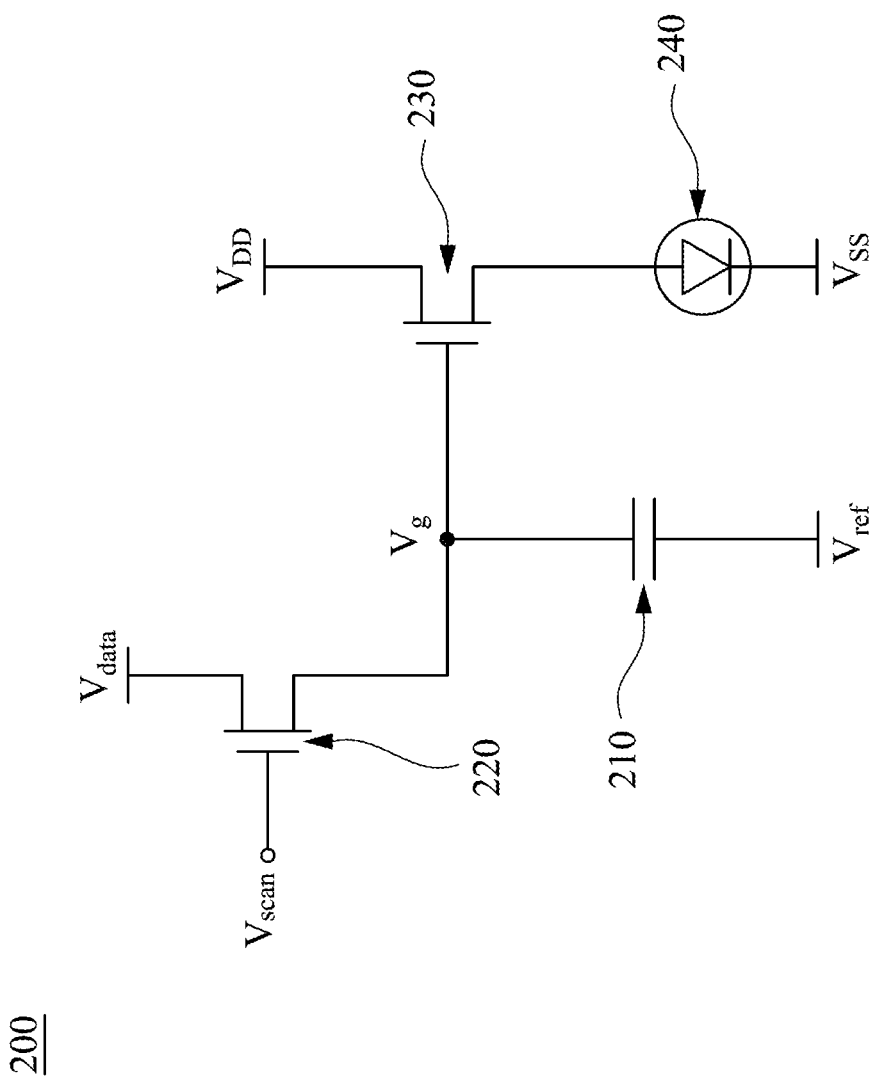
FIG. 7 is a schematic diagram of a micro light-emitting diode driving circuit in some embodiments of the present disclosure.

Reference is made to FIG. 7. FIG. 7 is a schematic diagram of a micro light-emitting diode driving circuit 200 in some embodiments of the present disclosure. The micro light-emitting diode driving circuit 200 includes a storage capacitor 210, a switching transistor 220, a driving transistor 230, and a micro light-emitting diode 240. The storage capacitor 210 has two ends, and one of the two ends can be connected to a reference signal Vref. The switching transistor 220 has three terminals. One of the three terminals is a gate terminal connected to a scan line Vscan, another one of the three terminals is a drain terminal connected to a data line Vdata, and a remaining one of the three terminals is a source terminal connected to the other end of the storage capacitor 210. The driving transistor 230 has a gate terminal (with applied gate voltage, Vg) connected to the source terminal of the switching transistor 220. The driving transistor 230 has a drain terminal connected to a driving voltage source $V_{DD}$, and a source terminal. It should be noted that, the driving transistor 230 described herein is restricted to the driving transistors as illustrated by the embodiments shown in FIGS. 1A, 1C, 1D, 2A, 2B, and 3 to 6. They can be briefly expressed as different types of asymmetric thin film transistors. Specifically, the drain terminal and the source terminal of the driving transistor 230 respectively correspond to (i.e., serve as) the drain electrode (e.g., the drain electrodes 116, 116', 116b, 116c, 116e) and the source electrode (e.g., the source electrodes 117, 117', 117a, 117b, 117c, 117d, 117e), and the gate terminal of the driving transistor corresponds to (i.e., serves as) the top gate 140c, 140d or 140e and the bottom gate 112, 112', 112b, or 112c, 112d.

The micro light-emitting diode driving circuit 200 also includes a micro light-emitting diode 240. The micro light-emitting diode 240 has an anode connected to the source terminal of the driving transistor 230, and a cathode connected to a low voltage source $V_{ss}$. It should be noted that, the micro light-emitting diode 240 described herein is restricted to the micro light-emitting diode (e.g., the micro light-emitting diodes 120, 120e . . . etc.) as illustrated by the embodiment shown in FIGS. 1A to 1D, 2A, 2B, and 3 to 6. In some embodiments, the anode can correspond to (i.e., serve as) the bottom electrode 130 or 130e of the micro light-emitting diode 120, or 120e.

Figure 8:
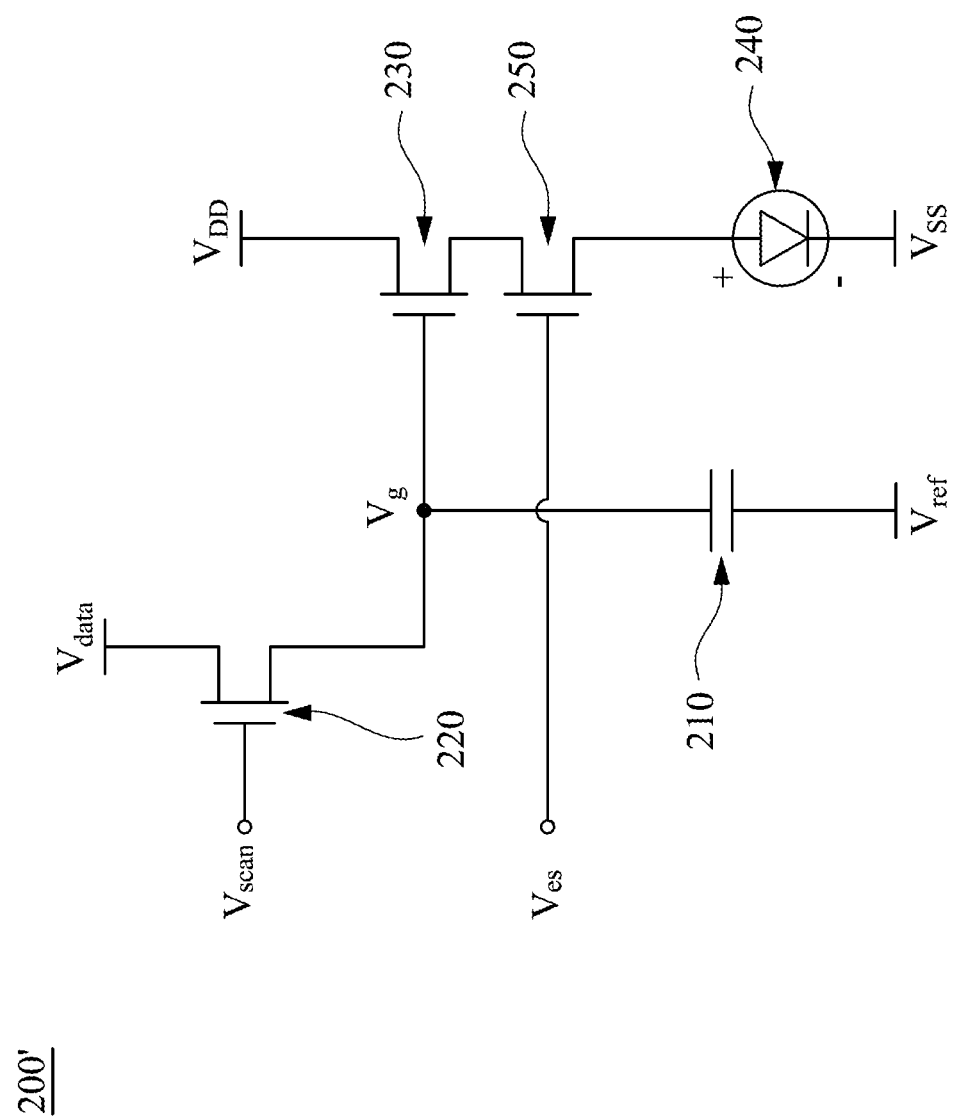
FIG. 8 is a schematic diagram of a micro light-emitting diode driving circuit in some embodiments of the present disclosure.

Reference is made to FIG. 8. FIG. 8 is a schematic diagram of a micro light-emitting diode driving circuit 200' in some embodiments of the present disclosure. In some embodiments, the micro light-emitting diode driving circuit 200' as shown in FIG. 8 further includes an emission control transistor 250 having three terminals. One of the three terminals is a gate terminal connected to an emission signal $V_{es}$. The emission control transistor 250 is electrically connected to the driving transistor 230 and the micro light-emitting diode 240 in series. In some embodiments, another one of the three terminals is a drain terminal connected to the source terminal of the driving transistor 230, and a remaining one of the three terminals is a source terminal connected to the anode of the micro light-emitting diode 240, as shown in FIG. 8. In some other embodiments, the drain terminal of the emission control transistor 250 is connected to the source terminal of the driving transistor 230, and the source terminal of the emission control transistor 250 is connected to the low voltage source $V_{ss}$. The emission control transistor 250 can give an ON/OFF function in a specified frequency to modify the brightness of the micro light-emitting diode. It should be noted that, other equivalent connecting ways performing similar functions of said emission control transistor 250 does not depart the scope of the present disclosure.

Figure 9:
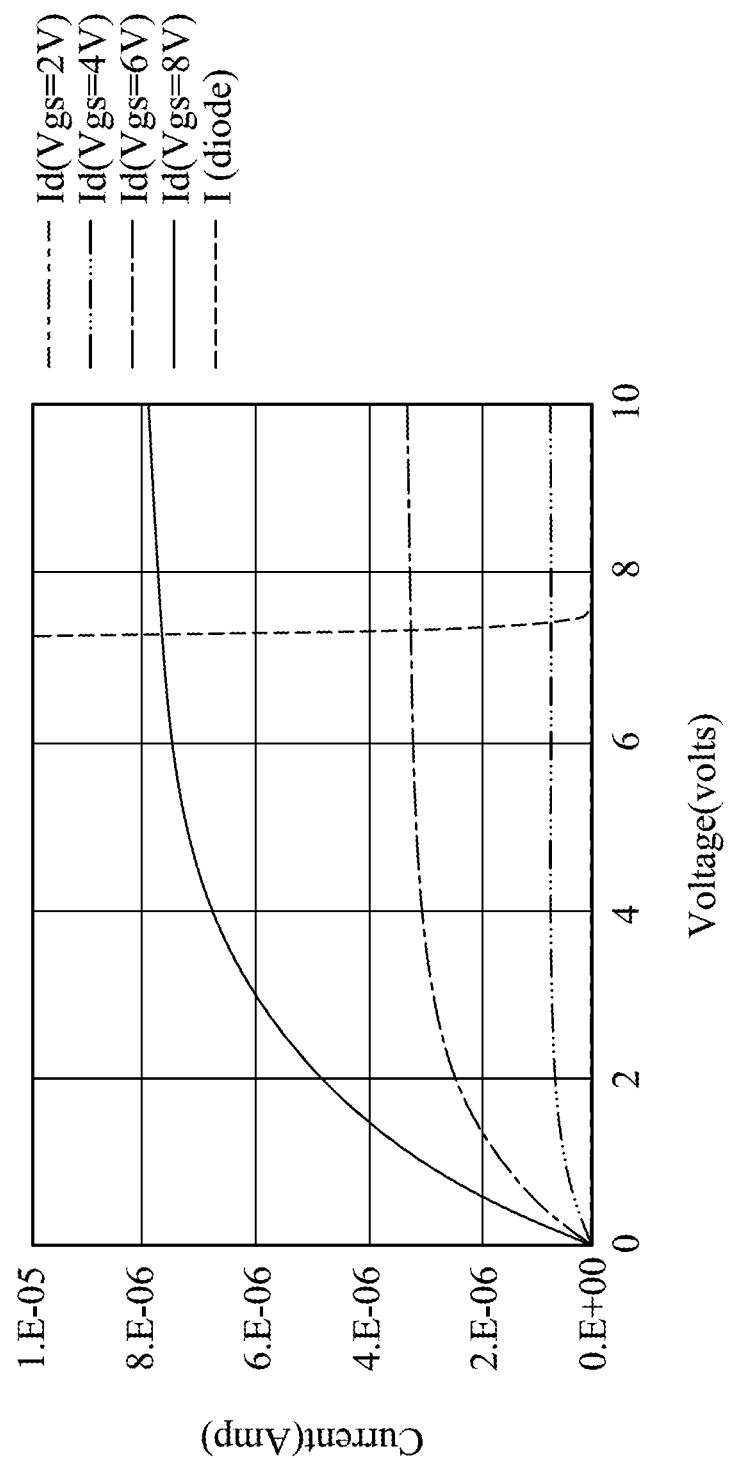
FIG. 9 is a current-voltage curve of the micro light-emitting diode display device according to some embodiments of the present disclosure.

Reference is made to FIG. 9. FIG. 9 is a current-voltage curve of the micro light-emitting diode display device 100 according to some embodiments of the present disclosure.

The curves of Vgs=2 V, Vgs=4 V, Vgs=6 V, and Vgs=8 V are drain-source current (Id) versus drain-source voltage ($V_{DS}$) of the driving transistor 110. The curve of a diode is a current-voltage (I-V) curve of the micro light-emitting diode 120 when the driving transistor 110 and the micro light-emitting diode 120 are combined into the light emitting driving circuit 200 as shown in FIG. 7. The characteristic sizes corresponding to the current-voltage curves of FIG. 9 are that the channel length of the semiconductor layer 114 is about 8 μm, and the channel width of the semiconductor layer 114 is about 50 μm. With the combination of the driving transistor 110 (acts as the driving transistor 230) and the micro light-emitting diode 120 with the current injection channel 122 therein (acts as the micro light-emitting diode 240) in the micro light-emitting diode driving circuit 200, 200', a voltage applied by the driving voltage source $V_{DD}$ can be lowered to be less than about 8 volt (V) but still in the working range of light-emitting mode of the micro light-emitting diode 120, so that a low power micro light-emitting diode driving circuit can be realized compared to a thin film transistor with conventional shape with a conventional organic light-emitting diodes (OLED). Specifically, since a driving voltage applied in a circuit with conventional transistor and OLED therein shall be at least higher than or equal to 12V to light up the OLED, as a comparison, the embodiments of the present disclosure can reduce the power consumption of a circuit. There are two structural features which shall be satisfied to achieve said reduction of power consumption. One is asymmetric thin film transistor, in which the drain electrode encloses the source electrode, such that a contact length between the drain electrode and the semiconductor layer is greater than a contact length between the source electrode and the semiconductor layer. In such a configuration, a pinch-off point of the current-voltage curve of the driving transistor (i.e., a source-drain voltage corresponding to a pinch-off point of the driving transistor) is shifted to a lower voltage, such that a saturation region extends to a lower voltage compared to a conventional symmetric thin film transistor or metal-oxide-semiconductor field effect transistor (MOSFET). The other structural feature is that the micro light-emitting diode shall include a current injection channel present in the micro light-emitting diode, and the current injection channel shall be separated from a side surface of the micro light-emitting diode, such as embodiments illustrated by FIG. 1B. In such a configuration, a current density flowing through the micro light-emitting diode increases due to a reduction of a light emitting area of the active layer 126, and the surface recombination is avoided, such that a voltage needed to light up the micro light-emitting diode can be reduced. Combining said two structural features and an equation that $V_{DD}=V_{DS}+V_{diode}$ ($V_{diode}$ is a voltage across the micro light-emitting diode, and $V_{DD}$ is a driving voltage source shown in FIG. 9), the voltage applied by the driving voltage source ($V_{00}$) can be less than 8V, with a driving voltage for the micro light-emitting diode equals to, e.g., about 3 V, which can be achieved by the micro light-emitting diode 120 as illustrated by the embodiments shown in FIG. 1B. In some embodiments, $V_{DD}$ can be less than 6V. In some embodiments, $V_{DD}$ can be less than 5V. Since $V_{DS}$ is decreased due to low $V_{DD}$, a stress in the driving transistor can be reduced, so as to enhanced the reliability of the driving transistor.

Figure 10A:
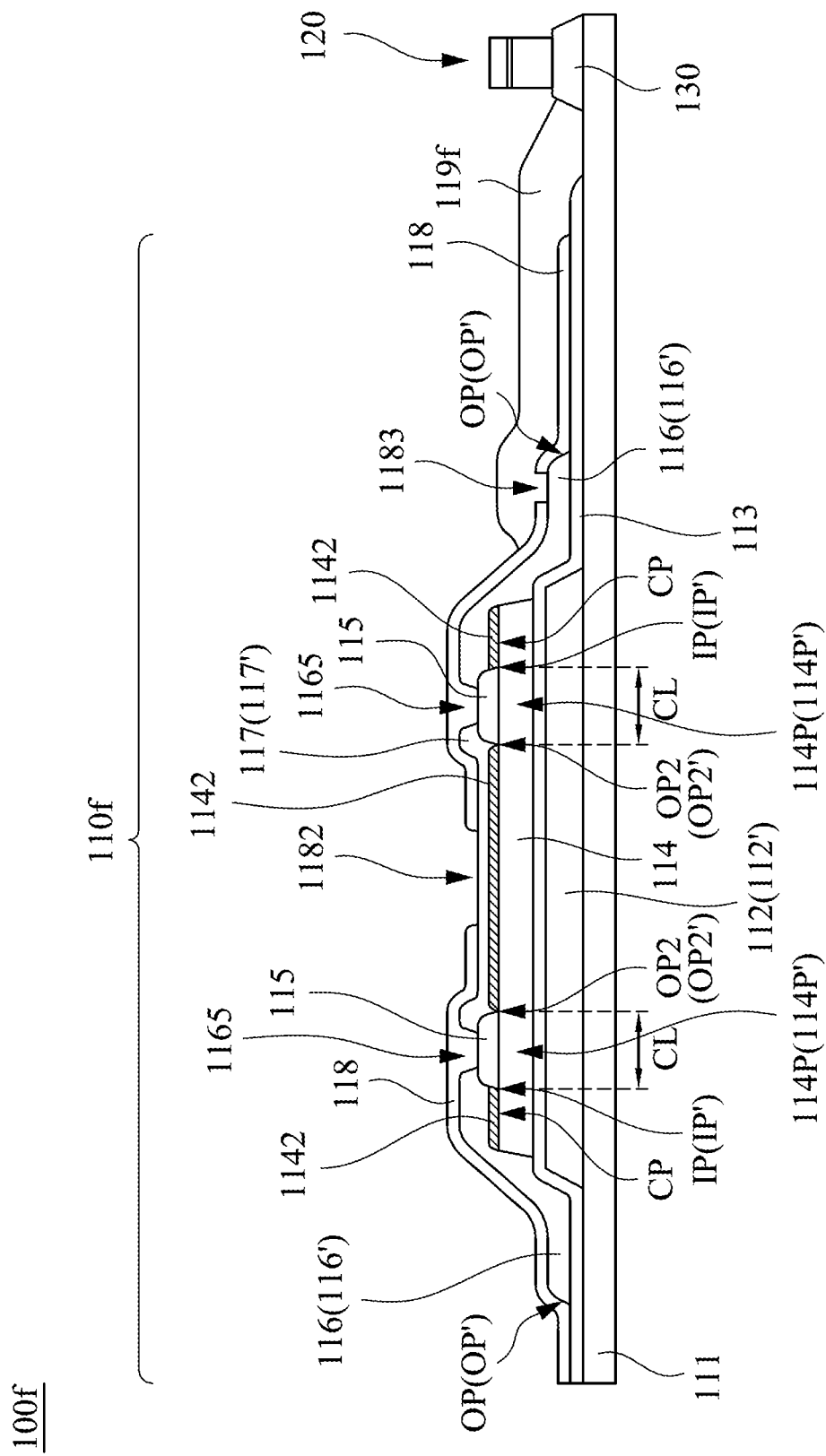
FIG. 10A is a cross-sectional view of a micro light-emitting diode display device according to some embodiments of the present disclosure.
Figure 10B:
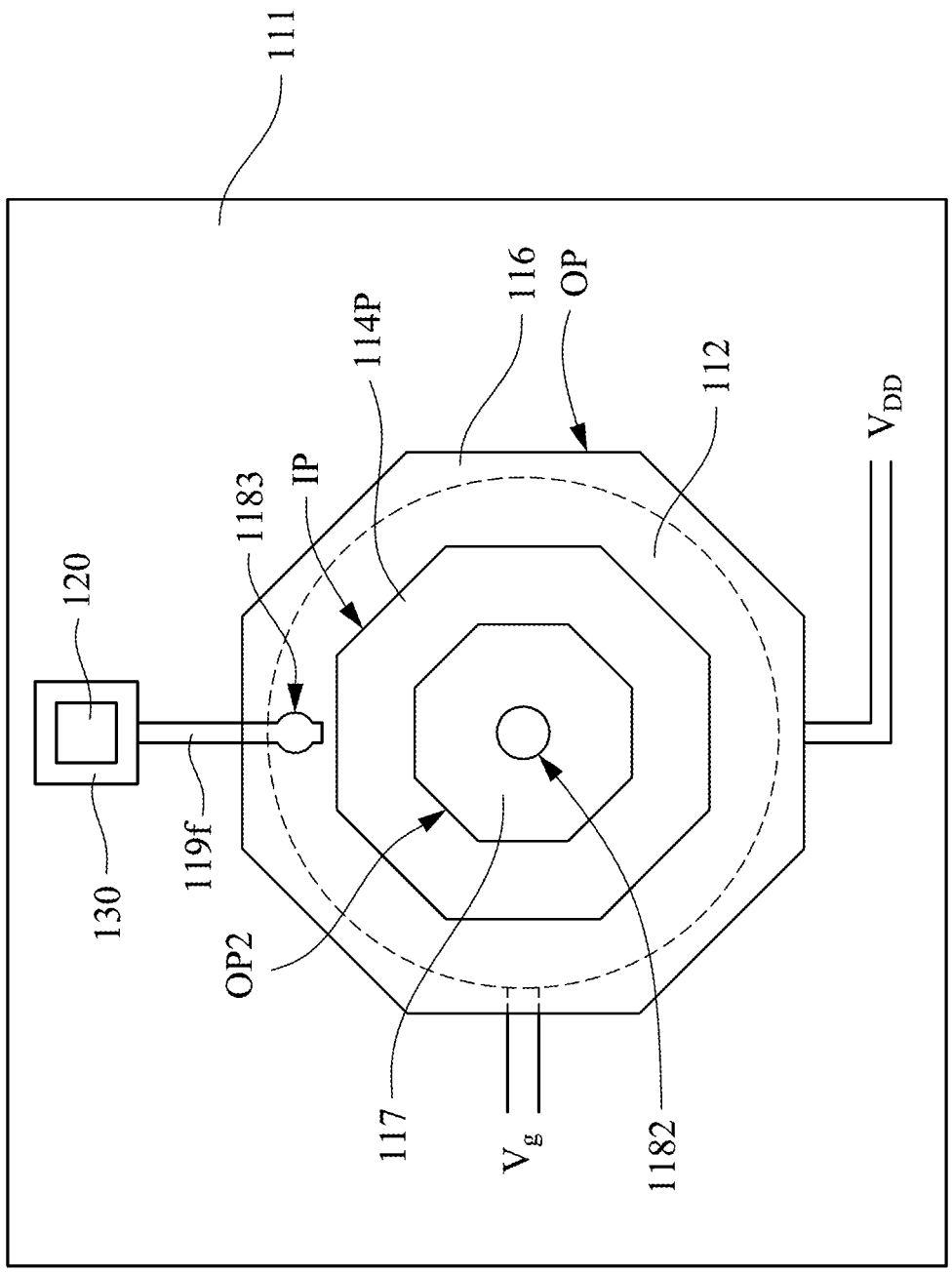
FIG. 10B is a top view of a micro light-emitting diode display device according to some embodiments of the present disclosure.
Figure 10C:
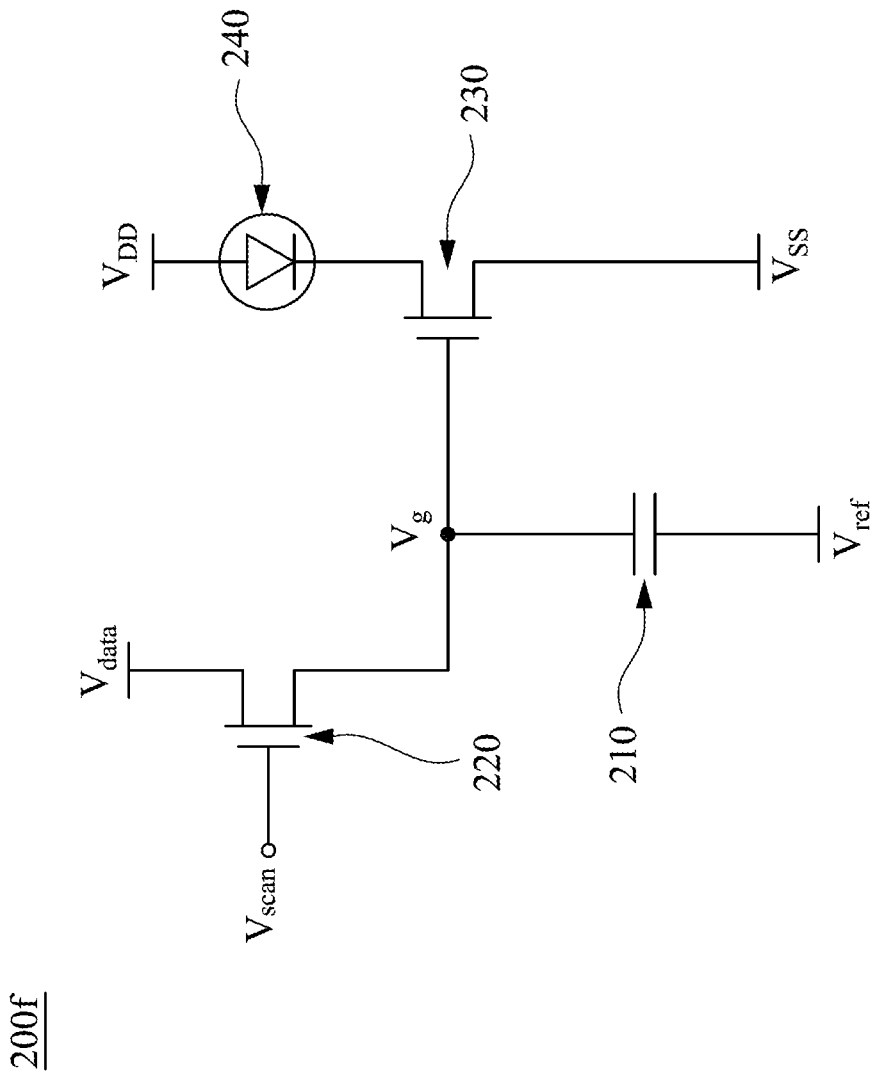
FIG. 10C is a schematic diagram of a micro light-emitting diode driving circuit in some embodiments of the present disclosure.

It should be noted that, some minor modifications on a sequence of circuit elements in circuitries as mentioned in the embodiments of the present disclosure do not depart from the claimed scope. An example is shown below. Reference is made to FIGS. 10A, 10B, and 10C. FIG. 10A is a cross-sectional view of a micro light-emitting diode display device 100f according to some embodiments of the present disclosure. FIG. 10B is a top view of a micro light-emitting diode display device 100f according to some embodiments of the present disclosure. FIG. 10C is a schematic diagram of a micro light-emitting diode driving circuit 200f in some embodiments of the present disclosure. In some embodiments, the connecting electrode 119f is electrically connected to the drain electrode 116 (116') through the via 1183, and is electrically isolated from the source electrode 117 (117'). The configuration is shown in FIGS. 10A and 10B, and the corresponding micro light-emitting diode driving circuit 200f is shown in FIG. 10C. Specifically, in the above configuration, since the connecting electrode 119f is electrically connected to the drain electrode 116 (116'), the micro light-emitting diode 120 shall be present in an upside-down way compared to that in FIG. 1A. That is, the second type semiconductor layer 128 (e.g., the n-type semiconductor layer) is in contact with the bottom electrode 130 and, the bottom electrode 130 is in contact with the connecting electrode 119f. The reflection of the above structure on the micro light-emitting diode driving circuit 200f is that, positions of the driving transistor 230 and the micro light-emitting diode 240 are swapped, such that the anode of the micro light-emitting diode 240 is connected to the driving voltage source $V_{DD}$, and the cathode of the micro light-emitting diode 240 is connected to the drain electrode 116 (116') of the driving transistor 230 (110f). The source electrode 117 (117') of the driving transistor 230 is connected to the low voltage source $V_{ss}$, as shown in FIG. 10C.

It should also be noted that, the above advantages cannot be achieved by a driving circuit based on a thin film transistor with conventional shape (with a conventional OLED) since a minimum voltage to light up an OLED shall generally be higher than or equal to 12V. It is the design of the current injection channel plus the shifted pinch-off point realized by the specific driving transistor (i.e., asymmetric thin film transistor) that makes the low power driving feasible.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A micro light-emitting diode display device, comprising:
   a driving transistor comprising:
     a substrate;
     a bottom gate present on the substrate;
     a gate insulator present on the bottom gate;
     a semiconductor layer present on the gate insulator;
     an etch stopper present on the semiconductor layer, wherein the etch stopper is ring-shaped;
     a drain electrode present on the etch stopper and in contact with the semiconductor layer, wherein the drain electrode is ring-shaped and a contact portion between the drain electrode and the semiconductor layer surrounds the semiconductor layer;

a source electrode present on the etch stopper and in contact with the semiconductor layer, wherein the source electrode is enclosed by the drain electrode, and the drain electrode and the source electrode form a ring-shaped opening, and at least a portion of the etch stopper is exposed by the ring-shaped opening; and an insulating layer present on the drain electrode, the source electrode, and the etch stopper, wherein the insulating layer has at least one via therein to expose a portion of one of the source electrode and the drain electrode, or to expose a portion of the source electrode and a portion of the drain electrode; and a micro light-emitting diode having a lateral length less than or equal to 50 μm electrically connected to one of the source electrode and the drain electrode, comprising:

a first type semiconductor layer;

an active layer present on and joined with the first type semiconductor layer; and a second type semiconductor layer present on and joined with the active layer, wherein a current injection channel is extended within one of the first type semiconductor layer and the second type semiconductor layer of the micro light-emitting diode, and the current injection channel is separated from a side surface of the micro light-emitting diode.

2. The micro light-emitting diode display device of claim 1, wherein the micro light-emitting diode is in contact with one of the source electrode and the drain electrode.

3. The micro light-emitting diode display device of claim 1, further comprising a connecting electrode present on the insulating layer and in contact with one of the source electrode and the drain electrode through the via.

4. The micro light-emitting diode display device of claim 3, further comprising a bottom electrode present on the substrate and in contact with the connecting electrode of the driving transistor, wherein the micro light-emitting diode is in contact with the bottom electrode.

5. The micro light-emitting diode display device of claim 1, wherein the bottom gate is ring shaped.

6. The micro light-emitting diode display device of claim 5, wherein the bottom gate encloses a portion of the source electrode.

7. The micro light-emitting diode display device of claim 1, wherein the semiconductor layer is ring shaped.

8. The micro light-emitting diode display device of claim 7, wherein the source electrode is in contact with the gate insulator.

9. The micro light-emitting diode display device of claim 7, wherein the semiconductor layer encloses a portion of the source electrode.

10. The micro light-emitting diode display device of claim 1, wherein a shape of a vertical projection of an inner periphery of the contact portion between the drain electrode and the semiconductor layer on the substrate is octagonal.

11. The micro light-emitting diode display device of claim 1, wherein a shape of a vertical projection of an inner periphery of the contact portion between the drain electrode and the semiconductor layer on the substrate is circular.

12. The micro light-emitting diode display device of claim 1, wherein a shape of a vertical projection of an outer periphery of the drain electrode on the substrate is octagonal.

13. The micro light-emitting diode display device of claim 1, wherein a shape of a vertical projection of an outer periphery of the drain electrode on the substrate is circular.

14. The micro light-emitting diode display device of claim 1, further comprising a top gate, wherein at least a portion of the top gate is present on the insulating layer.

15. The micro light-emitting diode display device of claim 14, further comprising a passivation layer present on the portion of the top gate.

16. The micro light-emitting diode display device of claim 14, wherein a vertical projection of the top gate on the substrate is overlapped with a vertical projection of at least a portion of the bottom gate on the substrate.

17. A micro light-emitting diode driving circuit, comprising:

a storage capacitor having two ends;

a switching transistor having a gate terminal connected to a scan line, a drain terminal connected to a data line, and a source terminal connected to one end of the storage capacitor;

a micro light-emitting diode having a lateral length less than or equal to 50 μm, comprising:

a first type semiconductor layer;

an active layer present on and joined with the first type semiconductor layer; and a second type semiconductor layer present on and joined with the active layer, wherein a current injection channel is extended within one of the first type semiconductor layer and the second type semiconductor layer of the micro light-emitting diode, and the current injection channel is separated from a side surface of the micro light-emitting diode, the micro light-emitting diode having an anode and a cathode respectively connected to the first type semiconductor layer and the second type semiconductor layer, wherein the micro light-emitting diode receives a first driving voltage from a driving voltage source and is electrically connected to the low voltage source;

a driving transistor having a gate terminal, a drain terminal, and a source terminal, the gate terminal being connected to the source terminal of the switching transistor, the micro light-emitting diode being electrically connected to one of the source terminal and the drain terminal of the driving transistor, the driving transistor receiving a second driving voltage from a driving voltage source and being electrically connected to the low voltage source, the driving transistor being selected from one of a first structure and a second structure, wherein the first structure comprises:

a first substrate;

a first bottom gate present on the first substrate;

a first gate insulator present on the first bottom gate;

a first semiconductor layer present on the first gate insulator;

a first etch stopper present on the first semiconductor layer, wherein the first etch stopper is ring-shaped;

a first drain electrode present on the first etch stopper and in contact with the first semiconductor layer, wherein the first drain electrode is ring-shaped and a contact portion between the first drain electrode and the first semiconductor layer surrounds the first semiconductor layer;

a first source electrode present on the first etch stopper and in contact with the first semiconductor layer, wherein the first source electrode is enclosed by the first drain electrode, the first drain electrode and the first source electrode form a first ring-shaped opening, at least a portion of the first etch stopper is exposed by the first ring-shaped opening, and the first drain electrode and the first source electrode respectively correspond to the drain terminal and the source terminal of the driving transistor; and a first insulating layer present on the first drain electrode, the first source electrode, and the first etch stopper, wherein the first insulating layer has at least one via therein to expose a portion of one of the first source electrode and the first drain electrode, or to expose a portion of the first source electrode and a portion of the first drain electrode;

the second structure comprises:

a second substrate;

a second bottom gate present on the second substrate;

a second gate insulator present on the second bottom gate;

a second semiconductor layer present on the second gate insulator;

a second etch stopper present on the second semiconductor layer, wherein the second etch stopper is ring-shaped;

a second drain electrode present on the second etch stopper and in contact with the second semiconductor layer, wherein the second drain electrode is ring-shaped and a contact portion between the second drain electrode and the second semiconductor layer surrounds the second semiconductor layer;

a second source electrode present on the second etch stopper and in contact with the second semiconductor layer, wherein the second source electrode is enclosed by the second drain electrode, and the second drain electrode and the second source electrode form a second ring-shaped opening, at least a portion of the second etch stopper is exposed by the second ring-shaped opening, and the second drain electrode and the second source electrode respectively correspond to the drain terminal and the source terminal of the driving transistor;

a second insulating layer present on the second drain electrode, the second source electrode, and the second etch stopper, wherein the second insulating layer has at least one via therein to expose a portion of one of the second source electrode and the second drain electrode, or to expose a portion of the second source electrode and a portion of the second drain electrode; and a first top gate, wherein at least a portion of the first top gate is present on the second insulating layer.

18. The micro light-emitting diode driving circuit of claim 17, further comprising an emission control transistor having a gate terminal connected to an emission signal, the emission control transistor being electrically connected to the driving transistor and the micro light-emitting diode in series.

* * * * *